US008451925B2

(12) United States Patent
Yan et al.

(10) Patent No.: US 8,451,925 B2
(45) Date of Patent: May 28, 2013

(54) METHOD AND PRE-CORRECTOR FOR CORRECTING SIGNALS IN RADIO FREQUENCY LINKS

(75) Inventors: Gang Yan, Beijing (CN); Xiaolin Zhang, Beijing (CN); Jianjun Zhi, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 677 days.

(21) Appl. No.: 12/679,723

(22) PCT Filed: Sep. 27, 2008

(86) PCT No.: PCT/CN2008/001669
§ 371 (c)(1),
(2), (4) Date: Mar. 24, 2010

(87) PCT Pub. No.: WO2009/046627
PCT Pub. Date: Apr. 16, 2009

(65) Prior Publication Data
US 2010/0202563 A1 Aug. 12, 2010

(30) Foreign Application Priority Data

Sep. 27, 2007 (CN) .......................... 2007 1 0175226

(51) Int. Cl.
*H04B 7/02* (2006.01)
*H04L 25/03* (2006.01)
(52) U.S. Cl.
USPC ......................................... 375/267; 375/296
(58) Field of Classification Search
USPC .................. 375/260, 267, 296, 297
See application file for complete search history.

(56) References Cited

U.S. PATENT DOCUMENTS

| 7,769,100 | B2 * | 8/2010 | Cheong et al. ................ 375/285 |
| 2003/0104794 | A1 | 6/2003 | Yang et al. |
| 2004/0136470 | A1 | 7/2004 | DeBruyn et al. |
| 2006/0104382 | A1 * | 5/2006 | Yang et al. ..................... 375/267 |
| 2006/0141955 | A1 * | 6/2006 | Karjalainen et al. ........ 455/114.3 |
| 2010/0157929 | A1 * | 6/2010 | Karabinis ..................... 370/329 |

FOREIGN PATENT DOCUMENTS

| CN | 1335669 A | 2/2002 |
| CN | 1518209 A | 8/2004 |
| WO | WO-2007/035358 A2 | 3/2007 |

OTHER PUBLICATIONS

International Search Report issued for PCT/CN2008/001669, date mailed Jan. 8, 2009.

* cited by examiner

*Primary Examiner* — Don N Vo
(74) *Attorney, Agent, or Firm* — Dickstein Shapiro LLP

(57) ABSTRACT

A method and pre-corrector for correcting signals in radio frequency links are provided. The method comprises: obtaining, in a time division order, a set of pre-distortion vectors for the respective radio frequency links by using one and the same set of pre-distortion vector obtaining means based on difference in arrival time of cyclic delay frames in the respective radio frequency links of a multiple input multiple output (MIMO) system; and correcting a subsequent signal in the respective radio frequency links by using the set of pre-distortion vectors corresponding to that radio frequency link. With the present invention, it is only required to scan a frame header once to generate an error vector table for the input signal across the entire dynamic range of power. The device can be reused by utilizing the cyclic delay frame structure, so as to achieve high linearity of a radio frequency header.

11 Claims, 2 Drawing Sheets

METHOD AND PRE-CORRECTOR FOR CORRECTING SIGNALS IN RADIO FREQUENCY LINKS

FIELD OF THE INVENTION

The present invention relates to communication field, and more particularly, to a method and pre-corrector for correcting signals in radio frequency links by means of cyclic delay frame header training.

BACKGROUND OF THE INVENTION

An Orthogonal Frequency Division Multiplexing (OFDM) modulated signal has a high peak-to-average ratio, which requires high linearity in a power amplifier at radio frequency frontend. However, since a terminal has limited power consumption, it is not suitable to obtain high linearity by increasing the static power consumption of the power amplifier. Moreover, as high order Quadrature Amplitude Modulation (QAM) on OFDM sub-carriers is susceptible to non-linearity in both amplitude and phase of the amplifier, a pre-correction method is needed such that the terminal power amplifier can output linear amplification signals ultimately.

In a Multiple Input Multiple Output (MIMO) terminal, multiple paths of radio frequency signals are coupled with each other, which results in advance of power compression, multi-tone inter-modulation and increase in adjacent channel leakage ratio of the power amplifier. Particularly, adjacent channel rejection ratio and linearity are also deceased and even it cannot satisfy requirements on bandwidth (100 MHz) and rate (×100 Mbps) by International Mobile Telecommunication (IMT)-Advanced. Thus, it is necessary to increase linearity by using a pre-corrector. In addition, each pre-corrector in a MIMO system requires a down-mixer. These down-mixers should be multiplexed on a terminal in order to save space and to reduce system complexity. Therefore, the design of the MIMO radio frequency frontend to achieve high linearity and low crosstalk in a terminal becomes a problem to be solved.

There is an existing solution where each of radio frequency links at radio frequency frontend is subjected to feedforward on an individual path, or further includes pre-distortion correction for feedback detection.

However, this solution has the following drawbacks:

1) Repetitive updates for pre-correction vector are required for a number of times. This approach is resource consuming, which leads to insufficient operation bandwidth of the corrector and failure to satisfy the requirement of 100 MHz by IMT-Advanced. The corrector needs to store input and output error vectors in a lookup table and to address, in accordance with the power of an input signal, the corresponding correction vector, so as to modify the input signal. Thus, the operation bandwidth of the corrector depends on a speed of updating and addressing of the lookup table. Due to a high code rate of broadband high speed communication, sequential detection of feedback signals for each time according to this method may cause many times of repetitive detection, occupation of resource consumption and thus decrease in addressing speed, such that the bandwidth of the high speed corrector for generating the correction vector is only about 30 MHz.

2) The linearity parameter cannot satisfy the requirement by IMT-Advanced. High speed broadband communication requires very high adjacent channel rejection ratio (−45 dBc) which has the following relationship with third-order inter-modulation:

$$ACLR_n = (2 \times [(P_{tot} - 3) - OIP3]) + Cn \quad (1)$$

where $P_{tot}$=a total output power of all carriers, in dBm,
OIP3=third-order inter-modulation of the device, in dBm,
$ACLR_n$=ACLR for the n-th carrier, in dBc,
Cn=deduction amount for performance degradation when n signals are input simultaneously, in dBc, and
C1-3, C2-9, C3-11, C4-12, C9=13.

When the input power reaches a typical value of 30 dBm, the third-order inter-modulation is required to be −51 dB, which is not achievable by existing pre-correctors.

3) For a MIMO terminal equipped with multiple-path radio frequency frontend, the input coupling is equivalent to input of a number of signal, which results in advance of output power compression and increase of inter-modulation component.

There is another existing solution where two matrix filters for dividing signal power uniformly are mounted respectively in front of and behind a multi-path amplifier, such that the peak power and the average power of the signal are close to each other. In this way, the requirement on linearity of the power amplifier at radio frequency frontend can be reduced.

However, this solution has the following drawbacks:

1) The peak power can only be reduced to 1/N of its own, where N is the number of radio frequency links and is generally less than 6. Thus, the resultant increase in linearity is less than 21 dBc. For a terminal with less than 4 number of antennas, the high linearity requirement by IMT-Advanced system cannot be satisfied.

2) The matrix filter is too large in size to be employed in a terminal.

3) The imperfect characteristics of the matrix filter may damage the premise based on which MIMO communication can establish, that is, low correlation among space division sub-channels.

SUMMARY OF THE INVENTION

An object of the present invention is to provide a method and pre-corrector for correcting signals in radio frequency links, so as to solve the problem of incapability of achieving high linearity and low crosstalk in MIMO radio frequency frontend in prior art.

To achieve the above object, a method for correcting signals in radio frequency links is provided, which comprises: obtaining, in a time division order, a set of pre-distortion vectors for the respective radio frequency links by using one and the same set of pre-distortion vector obtaining means based on the difference in arrival time of cyclic delay frames in the respective radio frequency links of a multiple input multiple output (MIMO) system; and correcting a subsequent signal in the respective radio frequency links by using the set of pre-distortion vectors corresponding to that radio frequency link.

According to the above method, obtaining the set of pre-distortion vectors for each of the radio frequency links comprises: scanning, by using a frame header of a cyclic delay frame of the MIMO system, a dynamic range of the power of input signals in the radio frequency link in which the frame resides; and obtaining the corresponding pre-distortion vectors by using the respective power points within the dynamic range, so as to obtain the set of pre-distortion vectors for the radio frequency link.

According to the above method, the range of power of the frame header includes: a waveform whose power value can cover the range of the power of input signals in the radio frequency link in which the frame resides.

According to the above method, the waveform is a periodic sawtooth wave.

According to the above method, obtaining the pre-distortion vector comprises: passing the waveform through the radio frequency link to form an output signal; performing down mixing and analog-to-digital conversion on the output signal to obtain a feedback signal; dividing/subtracting the feedback signal by/from the perfectly amplified waveform to obtain an error vector; and performing orthogonal decomposition on the error vector to obtain the pre-distortion vector.

According to the above method, correcting by using the set of pre-distortion vectors corresponding to the radio frequency link comprises: searching for the pre-distortion vector corresponding to the power of the subsequent signal; multiplying or adding the corresponding pre-distortion vector by or with the subsequent signal; and inputting the resultant signal to the radio frequency link to obtain an output signal which is amplified by a predetermined factor.

According to the above method, the transmitter can be a transmitter for any one of a digital cellular base station, a wireless terminal, a LAN access point device and/or a LAN card.

To achieve the above object, a pre-corrector is further provided, which comprises: at least two-path pre-distortion modulator, a pre-distortion vector generator and a one-path pre-distortion vector table module, the pre-distortion vector generator being configured to scan, by using a frame header of a cyclic delay frame of a multiple input multiple output (MIMO) system, a dynamic range of the power of input signals in the radio frequency link in which the frame resides, so as to obtain a set of pre-distortion vectors for the radio frequency link; the pre-distortion vector table module being configured to store the set of pre-distortion vectors; the two-path pre-distortion modulators being configured to correct a subsequent signal in respective radio frequency link by using the corresponding set of pre-distortion vectors; wherein the pre-distortion vector generator is further configured to obtain, in a time division order, a set of pre-distortion vectors for each radio frequency link based on the difference in arrival time of cyclic delay frames in the respective radio frequency links of the MIMO system and to store the obtained set of pre-distortion vectors in the pre-distortion vector table module.

The above pre-corrector further comprises a down mixer and an analog-to-digital converter configured to perform down mixing and analog-to-digital conversion on an output signal in the radio frequency link, so as to obtain a feedback signal which is then fed back to the pre-distortion vector generator; wherein the pre-distortion vector generator is configured to obtain the set of pre-distortion vectors by using the feedback signal.

According the above pre-corrector, the frame header includes: a waveform whose power value can cover an entire range of power of a power amplifier.

According to the above pre-corrector, the transmitter is a transmitter for any one of a digital cellular base station, a wireless terminal, a LAN access point device and/or a LAN card.

The present invention has the following technical effects. For a frame structure based on cyclic delay, the arrival time of the respective frame headers differs from each other. Thus, according to the present invention, it is only required to scan a frame header once to generate an error vector table for the input signal across the entire dynamic range of power. For a subsequently incoming data signal, instead of calculating the error vector and writing it into a storage table, it is only required to read the error vector according to the power of the data signal and to perform pre-distortion correction. Thus, after calculating the error vector for a frame header in a first path, the circuit can be switched to calculate the error vector for a frame header in a second path, such that the corrector can operate in a time division manner by utilizing the cyclic delay between the frame structures of multi-path input signals.

DETAILED DESCRIPTION OF THE PREFERRED EMBODIMENTS

The present invention will be detailed in the following with reference to the drawings and embodiments thereof, such that the objects, solutions and advantages will become more apparent.

Figure 3:
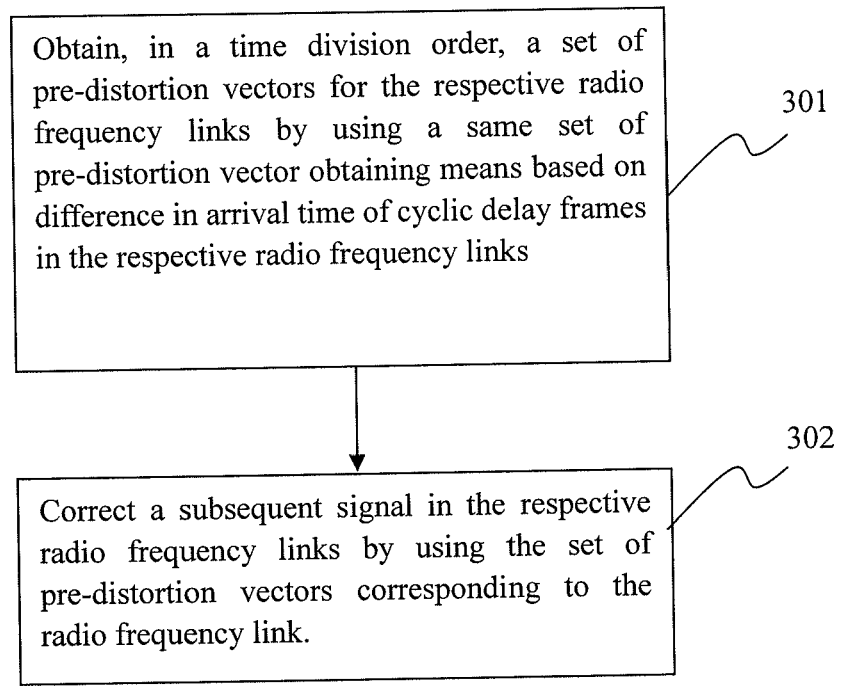
FIG. 3 is a flowchart illustrating the steps of the method according to the present invention.

FIG. 3 is a flowchart showing the steps of the method according to the present invention. As shown, the method for correcting signals in radio frequency links according to the present invention comprises the following steps.

At step 301, a set of pre-distortion vectors for respective radio frequency links is obtained in a time division order by using one and the same set of pre-distortion vector obtaining means, based on difference in arrival time of cyclic delay frames in the respective radio frequency links of a multiple input multiple output (MIMO) system. Herein, the process for obtaining the set of pre-distortion vectors for each of the radio frequency links comprises: scanning, by using a frame header of a cyclic delay frame of the MIMO system, a dynamic range of the power of input signals in the radio frequency link in which the frame resides; and obtaining the corresponding pre-distortion vectors by using the respective power points within the dynamic range, so as to obtain the set of pre-distortion vectors for the radio frequency link.

At step 302, a subsequent signal in the respective radio frequency links is corrected by using the set of pre-distortion vectors corresponding to the radio frequency link.

It is noted that, while the method has been described on a step-by-step basis, there is no strict limit on order between steps 301 and 302. Upon obtaining a set of pre-distortion vectors for a single-path radio frequency link, step 302 can be performed for that radio frequency link. At this moment, however, there may be some radio frequency links for which a set of pre-distortion vectors has not yet been obtained. Therefore, such a description of these steps is not intended to limit the order to perform the method according to the present invention.

Figure 1:
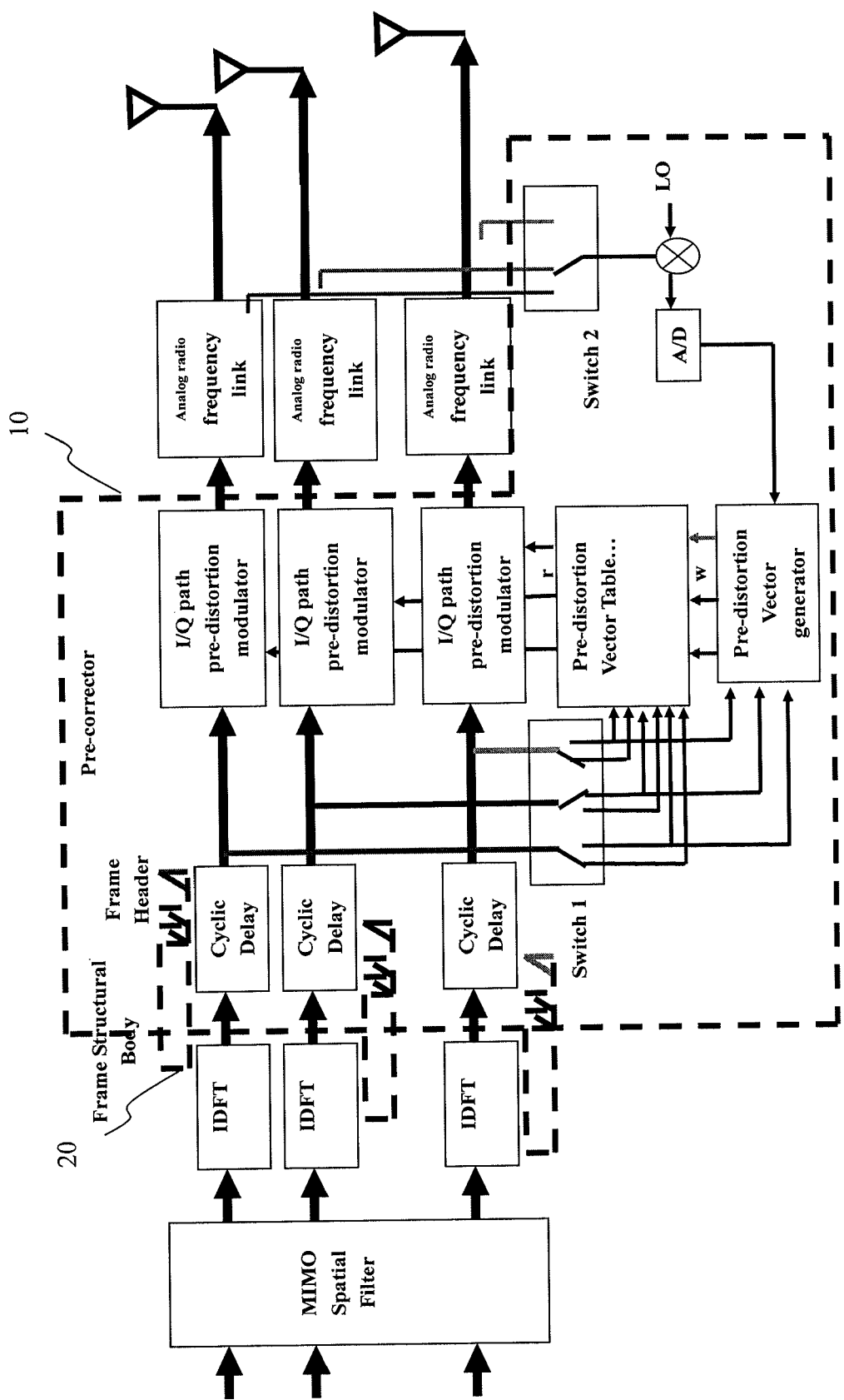
FIG. 1 shows a MIMO transmitter with an adaptive pre-corrector according to the present invention.

FIG. 1 shows a MIMO transmitter with an adaptive pre-corrector according to the present invention. As shown, multiple-path input signals for the MIMO system having burst frames 20 enter a pre-corrector 10, and transmitted by analog and radio frequency links after correction by the pre-corrector 10.

The operation principle of the pre-corrector will be described below.

In order to increase the linearity of a MIMO system, a nearly perfect linear amplification on input power by the radio frequency frontend of the transmitter is desirable, i.e., the amplification factor does not change with the change in input power. In practice, however, a radio frequency link, particularly a power amplifier, does not have its output power which is changed linearly with the change of the input power. For example, an output power amplified by a predetermined factor of 3 may be obtained at a first input power point, while another output power amplified by a factor of 2.5 can only be obtained when the input power changes to another power point. Thus, such a deviation need be pre-corrected such that an output power amplified by a predetermined factor can be obtained at any power point. In this way, for the pre-corrected signal, an output with linear amplitude amplification and linearly phase shift can be obtained even when it passes through an imperfect radio frequency link.

Herein, for the purpose of pre-correction, it is necessary to know the pre-distortion vectors corresponding to the respective power points of the input powers, which is a compensation value required for amplifying the input power at a certain power point by a predetermined factor. Such a pre-distortion vector can only be obtained by measurement.

The measurement of the pre-distortion vector needs to cover the entire dynamic range of a burst frame, such that a set of pre-distortion vectors corresponding to all power points can be obtained.

Figure 2:
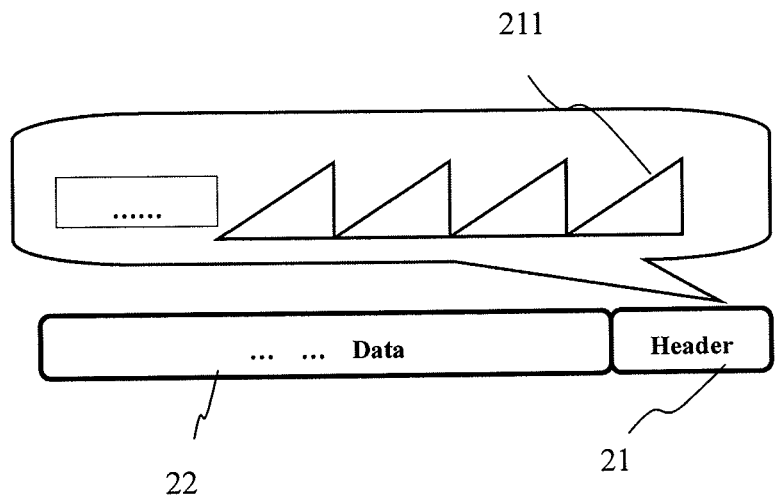
FIG. 2 is a schematic structural diagram of a burst frame.

FIG. 2 shows the structure of the burst frame 20, which includes a frame header 21 and a frame structural body 22. According to the present invention, the frame header 21 of the burst frame 20 is formed as periodical sawtooth shape 211 or any other undulated shape which can cover the entire dynamic range of the power of input signals. In this case, a set of pre-distortion vectors for all power points in the radio frequency link in which the frame resides can be obtained by measuring the frame header 21. In this way, it is not necessary to perform newly measurements for subsequent signals in that radio frequency link. Thus, according to the present invention, the error vector only needs to be generated once with respect to each radio frequency link. In this way, repetitive measurements for many times become unnecessary, which greatly reduce the requirement for the system clock speed and thus increases the operation bandwidth of the corrector.

The process for obtaining the pre-distortion vector is given below. The frame header of the burst frame 20 is designed as a periodic sawtooth waveform in time domain. The instantaneous power value of each sawtooth waveform covers the entire dynamic range of the power amplifier (i.e., the range from the minimum to the maximum powers of the input signal allowable for normal operation of the radio frequency link, which depend on the characteristics of the power amplifier). In a typical implementation, the frame header is of 256 bytes, with each sawtooth being composed of 64 bytes. The waveform of the frame header is not limited to the sawtooth wave. Rather, any time domain waveform for which instantaneous power traverses the dynamic range of the radio frequency link can be used. After the first sawtooth wave passes through the radio frequency link, the output signal is subjected to down mix and analog-to-digital conversion, and then is fed back and divided/subtracted by/from the perfectly amplified original signal so as to obtain an error vector. Since the error vector is a complex signal error, it can be orthogonally decomposed into two paths of errors, I and Q, to form a vector. One error vector can be obtained for each instantaneous stepsize. In this way, an error vector table for the radio frequency link across the entire dynamic range can be obtained by scanning over a sawtooth wave.

The correction process comprises: searching, on arrival of a subsequent signal, for the error vector corresponding to the power of the input signal and adding or multiplying it with the input signal, such that the signal after passing through the radio frequency link is output with linear amplification.

Reference is now made to FIG. 1. As shown, a burst frame 20 with a cyclic delay frame structure is used. In this case, the second path of frame header lags behind the first path of frame header temporally; the third path of frame header lags behind the second path of frame header; and so on. The calculation for generating an error vector is only required to be performed on the previous sawtooth wave or waves of a frame header. Thus, the frame header of the second link arrives after generation of the error vector table for the first link. Then, the error vector for the second link can be calculated. Pre-distortion for multiple-path radio frequency links can be implemented in a time division manner by using the down mixer, the A/D converter, the error vector generator and the error vector table as shown in FIG. 1 since the headers with the cyclic delay frame structure just arrive sequentially.

In addition to the implementation method, a pre-corrector is further provided according to the invention, which employs time division transceiver architecture in combination with the MIMO-OFDM frame structure. As such, cyclically delayed time domain frame headers are formed as a sawtooth-shape training sequence. The entire dynamic range of the power amplifier is scanned at the beginning of each frame. The error vector across the entire dynamic range is calculated from the output feedback and then written into a high speed lookup table. Since the error vector is only generated once for each burst frame, the requirement on the speed of the system clock is greatly reduced and the operation bandwidth of the corrector is increased. With the cyclic delay frame structure of MIMO-OFDM, the corrector can correct each path of radio frequency link sequentially in a time division manner, such that the down mixer and A/D converter in the corrector can be multiplexed, thereby significantly reducing the system complexity. Thus, it is very suitable for terminal devices with limited space.

It can be seen from the above description that the following advantages can be obtained by employing the present invention.

1) Multiple-antenna terminal is a new communicator for the next generation. In order to solve the pre-distortion correction problem of the radio frequency power amplifier as required for broadband high speed communication of multiple wireless transceivers, the method according to the present invention uses the cyclic delay frame structure of MIMO-OFDM as the training sequence of pre-distortion correction vector for the power amplifier, which is a new method.

2) With the cyclic delay frame structure, the number of updates for the error vector is reduced and the bandwidth of the corrector is expanded, thereby increasing the linearity of the corrected power amplifier.

3) With the cyclic delay frame structure, the corrector can be multiplexed.

4) It is suitable for the next generation broadband high speed communication. The requirement of a bandwidth of 100 MHz and a communication rate larger than 200 Mbps as required for the high speed communication of the next generation multimedia service can be satisfied.

5) The performance and the robustness can be improved. As the corrector can be multiplexed, multi-tone inter-modulation and power compression due to radio frequency coupling can be reduced, thereby increasing the linearity of the multi-link radio frequency frontend and reducing strays. Thus, it is particularly suitable for communication terminals with limited space.

In summary, for a frame structure based on cyclic delay, the arrival time of the respective frame headers differs from each other. Thus, according to the present invention, it is only required to scan a frame header once to generate an error vector table for the entire dynamic range. For a data signal at subsequent arrival, instead of calculating the error vector and writing it into a storage table, it is only required to read the error vector according to the power of the data signal and to perform pre-distortion correction. Thus, after calculating the error vector for a frame header in a first path, the circuit can be switched to calculate the error vector for a frame header in a second path, such that the corrector can operate in a time division manner by utilizing the cyclic delay between the frame structures of multiple-path input signals.

The foregoing description is only intended to provide the preferred embodiments of the present invention. It should be noted that those who skilled in the art can make various improvements and modifications without departing from the principle of the present invention. These improvements and modifications should be encompassed within the scope of the present invention.

What is claimed is:

1. A method for correcting signals in radio frequency links, comprising:
    obtaining, in a time division order, a set of pre-distortion vectors for the respective radio frequency links by using one and the same set of pre-distortion vector obtaining means based on difference in arrival time of cyclic delay frames in the respective radio frequency links of a multiple input multiple output (MIMO) system; and
    correcting a subsequent signal in the respective radio frequency links by using the set of pre-distortion vectors corresponding to the radio frequency link.

2. The method according to claim 1, wherein obtaining the set of pre-distortion vectors for each of the radio frequency links comprises: scanning, by using a frame header of a cyclic delay frame of the MIMO system, a dynamic range of the power of input signals in the radio frequency link in which the frame resides; and obtaining the corresponding pre-distortion vectors by using respective power points within the dynamic range, so as to obtain the set of pre-distortion vectors for the radio frequency link.

3. The method according to claim 2, wherein the range of power of the frame header includes: a waveform whose power value can cover the range of the power of input signals in the radio frequency link in which the frame resides.

4. The method according to claim 3, wherein the waveform is a periodic sawtooth wave.

5. The method according to claim 2, 3 or 1, wherein obtaining the pre-distortion vector comprises:
    passing the waveform through the radio frequency link to form an output signal;
    performing down mixing and analog-to-digital conversion on the output signal to obtain a feedback signal;
    dividing/subtracting the feedback signal by/from the perfectly amplified waveform to obtain an error vector; and
    performing orthogonal decomposition on the error vector to obtain the pre-distortion vector.

6. The method according to claim 5, wherein correcting by using the set of pre-distortion vectors corresponding to the radio frequency link comprises:
    searching for the pre-distortion vector corresponding to the power of the subsequent signal;
    multiplying or adding the corresponding pre-distortion vector by or with the subsequent signal; and
    inputting the resultant signal to the radio frequency link to obtain an output signal which is amplified by a predetermined factor.

7. The method according to claim 5, wherein the transmitter is a transmitter for a digital cellular base station, a wireless terminal, a LAN (Local Area Network) access point device and/or a LAN card.

8. A pre-corrector, comprising at least two-path pre-distortion modulator, one-path pre-distortion vector generator and a pre-distortion vector table module,
    the pre-distortion vector generator being configured to scan, by using a frame header of a cyclic delay frame of a multiple input multiple output (MIMO) system, a dynamic range of power of input signals in the radio frequency link in which the frame resides, so as to obtain a set of pre-distortion vectors for the radio frequency link;
    the pre-distortion vector table module being configured to store the set of pre-distortion vectors;
    the two-path pre-distortion modulator being configured to correct a subsequent signal in respective radio frequency link by using the corresponding set of pre-distortion vectors; wherein
    the pre-distortion vector generator is further configured to obtain, in a time division order, a set of pre-distortion vectors for respective radio frequency links based on difference in arrival time of cyclic delay frames in the respective radio frequency links of the MIMO system and to store the obtained set of pre-distortion vectors in the pre-distortion vector table module.

9. The pre-corrector according to claim 8, further comprising a down mixer and an analog-to-digital converter configured to perform down mixing and analog-to-digital conversion on an output signal in the radio frequency link, so as to obtain a feedback signal which is then fed back to the pre-distortion vector generator; wherein
    the pre-distortion vector generator is configured to obtain the set of pre-distortion vectors by using the feedback signal.

10. The pre-corrector according to claim 8, wherein the frame header includes: a waveform whose power value can cover an entire range of power of a power amplifier.

11. The pre-corrector according to claim 8, wherein the transmitter is a transmitter for a digital cellular base station, a wireless terminal, a LAN (Local Area Network) access point device and/or a LAN card.

* * * * *